United States Patent [19]

Matano et al.

[11] Patent Number: 5,357,474
[45] Date of Patent: Oct. 18, 1994

[54] DYNAMIC RANDOM ACCESS MEMORY DEVICE HAVING PRECHARGE CIRCUIT FOR INTERMITTENTLY AND SELECTIVELY CHARGING DATA LINE PAIRS

[75] Inventors: Tatsuya Matano; Tadahiko Sugibayashi; Hiroshi Takada, all of Tokyo, Japan

[73] Assignee: NEC Corporation, Tokyo, Japan

[21] Appl. No.: 136,884

[22] Filed: Oct. 18, 1993

[30] Foreign Application Priority Data

Oct. 19, 1992 [JP] Japan .................. 4-279720

[51] Int. Cl.⁵ .............................................. G11C 7/02
[52] U.S. Cl. .................. 365/203; 365/189.09;
 365/189.11; 365/204; 365/208; 365/230.06
[58] Field of Search ............... 365/203, 189.09, 189.11,
 365/230.06, 208, 204

[56] References Cited

U.S. PATENT DOCUMENTS 5,058,072 10/1991 Kashimura .................. 365/189.11
5,274,590 12/1993 Kashimura .................. 365/203

OTHER PUBLICATIONS

Y. Nakagome et al., "A 1.5V Circuit Technology for 64Mb DRAMs", 1990 IEEE Symposium on VLSI Circuits, pp. 17–18.

*Primary Examiner*—Joseph E. Clawson, Jr.
*Attorney, Agent, or Firm*—Sughrue, Mion, Zinn, Macpeak & Seas

[57] ABSTRACT

A semiconductor memory device comprises read-out circuits responsive to first column address decoded signals for transferring data bits from selected bit lines to data line pairs, selector circuits responsive to second column address decoded signals for transferring a data bit from selected one of the data line pairs to a read data amplifier circuit and a precharge circuit coupled between a source of power voltage level and the data line pairs for charging the selected data line pair before transmission of the data bit to the selected data line pair, and the precharge circuit isolates the data line pair from the source of power voltage level so that potential difference indicative of the data bit rapidly takes place on the selected data line pair.

14 Claims, 6 Drawing Sheets

DYNAMIC RANDOM ACCESS MEMORY DEVICE HAVING PRECHARGE CIRCUIT FOR INTERMITTENTLY AND SELECTIVELY CHARGING DATA LINE PAIRS

FIELD OF THE INVENTION

This invention relates to a dynamic random access memory device and, more particularly, to a data line precharge circuit incorporated in a dynamic random access memory device having a plurality of data line pairs respectively connected between selected memory cell blocks and a block selector unit.

DESCRIPTION OF THE RELATED ART

The memory cells of a dynamic random access memory device are grouped into a plurality of memory cell blocks, and the memory cell blocks are arranged in matrix. A row of memory cell blocks are selected, and data bits are concurrently read out from the row of memory cell blocks. A plurality pairs of data lines are provided for the selected row of memory cell blocks, and read-out circuits firstly transfer the plurality pairs of data lines each a data bit from the associated memory cell block. Secondly, a selector transfers a data bit on the selected pair of data lines to a read data amplifier, and the selected data bit in turn is transferred to an input/output data buffer circuit for producing an output data signal.

FIG. 1 illustrates a typical example of the dynamic random access memory device of the type selecting a data bit through the read-out circuit and the selector unit, and a plurality of data line pairs DL1 to DLi each consisting of first and second data lines DLa and DLb are terminated at selector circuits 11 to 1i, respectively.

A plurality of charging circuits 21 to 2i are respectively associated with the data line pairs DL1 to DLi, and each of the charging circuits 21 to 2i is implemented by a pair of n-channel enhancement type charging transistors Qn1 and Qn2. The source nodes and the gate electrodes of the charging transistors Qn1 and Qn2 are connected with a positive power voltage line Vdd, and the drain nodes are respectively connected with the associated data line pair DL1 or DLi. For this reason, the n-channel enhancement type charging transistors Qn1 and Qn2 are turned on at all times, and the data line pairs DL1 to DLi are charged to a certain voltage level VH lower than the positive power voltage Vdd by the threshold thereof before any read-out data bit does not reach read-out circuits 31 to 3i.

A plurality of read-out units 31 to 3i are associated with the plurality of data line pairs DL1 to DLi, and all of the read-out units 31 to 3i are identical in arrangement. Each of the read-out units 31 to 3i is implemented by four read-out circuits respectively coupled with four bit line pairs BL1, BL2, BL3 and BL4, and each of the read-out circuits READ1 to READ4 comprises two series combinations of n-channel enhancement type switching transistors Qn3/Qn4 and Qn5/Qn6 connected between the associated data lines DLa and DLb and a ground voltage line. The four bit line pairs BL1 to BL4 are coupled with four columns of memory cells forming a memory cell block. First column address decoded signals RS1 to RS4 are distributed to the n-channel enhancement type switching transistors Qn3 and Qn5 of the four read-out circuits READ1 to READ4 of each read-out unit, and one of the read-out circuits READ1 to READ4 is enabled with the first column address decoded signals RS1 to RS4. The bit line pairs BL1 to BL4 of each column of memory cell blocks are connected with the gate electrodes of the n-channel enhancement type switching transistors Qn4 and Qn6 of the associated read-out unit, and one of the data bits on the bit line pairs BL1, BL2, BL3 or BL4 causes the n-channel enhancement type switching transistors Qn4 and Qn5 to selectively turn on. As a result, the data bit on the selected bit line pair BL1 or BL4 is transferred to one of the data line pairs DL1 to DLi in the form of potential difference.

The selector circuits 11 to 1i have the same circuit arrangement, and are associated with the data line pairs DL1 to DLi. Each of the selector circuits 11 to 1i comprises two parallel combinations of p-channel enhancement type switching transistors and n-channel enhancement type switching transistors Qp7/Qn8 and Qp9/Qn10 and an inverter INV1. The parallel combinations Qp7/Qn8 and Qp9/Qn10 are respectively coupled with the associated data lines DL1 or DLi and a pair of common output nodes OUT1/OUT2 shared between all of the selector circuits 11 to 1i, and are responsive to second column address decoded signals YSEL1 to YSELi.

Namely, the second column address decoded signals YSEL1 to YSELi are distributed to the selector circuits 11 to 1i, respectively, and each of the second column address decoded signals is directly supplied to the gate electrodes of the p-channel enhancement type switching transistors Qp7 and Qp9 and through the inverter INV1 to the gate electrodes of the n-channel enhancement type switching transistors Qn8 and Qn10 of the associated selector unit. Since only one of the second column address decoded signals YSEL1 to YSELi goes down to the ground voltage level, one of the data line pairs DL1 to DLi is coupled with the pair of common output nodes OUT1 and OUT2, and a small potential difference due to difference in current between the data lines DLa and DLb is propagated from the selected data line pairs DL1 or DLi to the pair of common output nodes OUT1 and OUT2.

The output nodes OUT1 and OUT2 are connected with a read data amplifier circuit 4, and the read data amplifier circuit 4 comprises a preamplifier 4a implemented by four p-channel enhancement type amplifying transistors Qp11 to Qp14, a main differential amplifier 4b, two inverters INV2 and INV3 connected with the main differential amplifier 4b and two n-channel enhancement type driving transistors Qn15 and Qn16.

The small potential difference between the output nodes OUT1 and OUT2 is amplified by the preamplifier 4a, and supplies a potential difference to two input/output nodes of the main differential amplifier 4b. The main differential amplifier 4b increase the magnitude of the potential difference, and the increased potential difference is supplied through the inverters INV2 and INV3 to the gate electrodes of the n-channel enhancement type driving transistors Qn15 and Qn16. The n-channel enhancement type driving transistors Qn15 and Qn16 selectively ground output signal lines OUT3, and produces a potential difference indicative of the accessed data bit on the output signal lines OUT3.

FIG. 2 illustrates a read-out sequence for the prior art dynamic random access memory device, and the read-out sequence is described on the assumption that the accessed data bit is transferred through the bit line pair BL4 to the read-out circuit READ4 of the read-out unit 31.

The output signal lines OUT3, the data line pairs DL1 to DLi and the bit line pairs BL1 to BL4 have been already charged to the positive power voltage level Vdd, the high voltage level VH lower than the positive power voltage Vdd by the threshold of the n-channel enhancement type charging transistors Qn1 and Qn2 and a middle voltage level VM between the positive power voltage level Vdd and the ground voltage level GND.

The second column address decoded signal YSEL1 starts going down to the ground voltage level GND at time t1, and the data line pair DL1 is connected through the selector circuit 11 with the pair of output nodes OUT1 and OUT2.

The first column address decoded signal RS starts rising toward the positive power voltage level Vdd at time t2, and the read-out circuits READ4 of the respective read-out units 31 to 3i become ready state for response to potential differences on the bit line pairs BL4. However, the column selector circuit 11 allows only the data line pair DL1 to be coupled with the pair of output nodes OUT1 and OUT2.

Though not shown in FIG. 1, a word line causes a row of memory cell blocks to conduct with the associated sets of bit line pairs BL1 to BL4, and small potential differences take place on the sets of bit line pairs BL1 to BL4. The data bits in the form of potential difference are propagated to the read-out units 31 to 3i, and the read-out circuit READ4 of the unit 31 and the selector circuit 11 sequentially transfers one of the data bits to the output nodes OUT1 an OUT2. The voltage levels on the data line pair DL1 and, accordingly, on the output nodes OUT1 and OUT2 are gradually separated from each other, because the charging circuit 21 continuously supplies current to the data line pair DL1.

When the preamplifier 4a increases the small potential difference between the output nods OUT1 and OUT2 to a certain level large enough to be exactly treated by the main amplifier 4b, an activation signal DAE allows the main differential amplifier 4b to become responsive to the small potential difference from the preamplifier 4a at time t4, and the inverters INV2 and INV3 cause the n-channel enhancement type driving transistors Qn15 and Qn16 to turn on and off for developing a potential difference on the output signal lines OUT3.

A problem is encountered in the prior art dynamic random access memory device in that the sequential selection of the read-out data bits consumes long time period, and the access time is prolonged. This is because of the fact that the charging circuits 21 to 2i continuously supply current to the associated data line pairs DL1 to DLi.

Another problem inherent in the prior art dynamic random access memory device is the large amount of current consumption. This is resulted from the continuous charge to all of the data line pairs DL1 to DLi.

SUMMARY OF THE INVENTION

It is therefore an important object of the present invention to provide a dynamic random access memory device which is improved in access time.

It is another important object of the present invention to provide a dynamic random access memory device which is improved in current consumption.

To accomplish the first object, the present invention proposes to stop a charge to data line pairs before selection of a data line pair.

To accomplish the second object, the present invention proposes to charge a selected data line pair only.

In accordance with one aspect of the present invention, there is provided a semiconductor memory device comprising: a) a plurality of addressable memory cells arranged in rows and columns; b) a plurality of bit line pairs grouped into a plurality of bit line pair groups assigned respective first addresses, and associated with the plurality of addressable memory cells for transferring a plurality of data bits in the form of potential differences; c) a plurality of data line pairs respectively assigned second addresses; d) a first selecting means responsive to first address decoded signals indicative of one of the first addresses assigned to one of the plurality of bit line pair groups for transferring data bits between the bit line pairs of the selected bit line pair group and the plurality of data line pairs, respectively; e) a second selecting means responsive to second address decoded signals indicative of one of the second addresses for transferring one of the data bits between the data line pair assigned the second address and a data amplifier circuit; and f) a charging means coupled between a source of current and the plurality of data line pairs for charging to a predetermined voltage level before data bits are transferred to the plurality of data line pairs, the charging means isolating the plurality of data line pairs from the source of current when one of the data line of each data line pair reaches the predetermined level.

In accordance with another aspect of the present invention, there is provided a semiconductor memory device comprising: a) a plurality of addressable memory cells arranged in rows and columns; b) a plurality of bit line pairs grouped into a plurality of bit line pair groups assigned respective first addresses, and associated with the plurality of addressable memory cells for transferring a plurality of data bits in the form of potential differences; c) a plurality of data line pairs respectively assigned second addresses; d) a first selecting means responsive to first address decoded signals indicative of one of the first addresses assigned to one of the plurality of bit line pair groups for transferring data bits between the bit line pairs of the selected bit line pair group and the plurality of data line pairs, respectively; e) a second selecting means responsive to second address decoded signals indicative of one of the second addresses for transferring one of the data bits between the data line pair assigned the second address and a data amplifier circuit; and f) a charging means responsive to the second address decoded signals for charging the data line pair indicated by the second address decoded signal to a predetermined voltage level before data bits are transferred to the plurality of data line pairs.

BRIEF DESCRIPTION OF THE DRAWINGS

The features and advantages of the random access memory device according to the present invention will be more clearly understood from the following description taken in conjunction with the accompanying drawings in which.

DESCRIPTION OF THE PREFERRED EMBODIMENTS

First Embodiment

Figure 1:
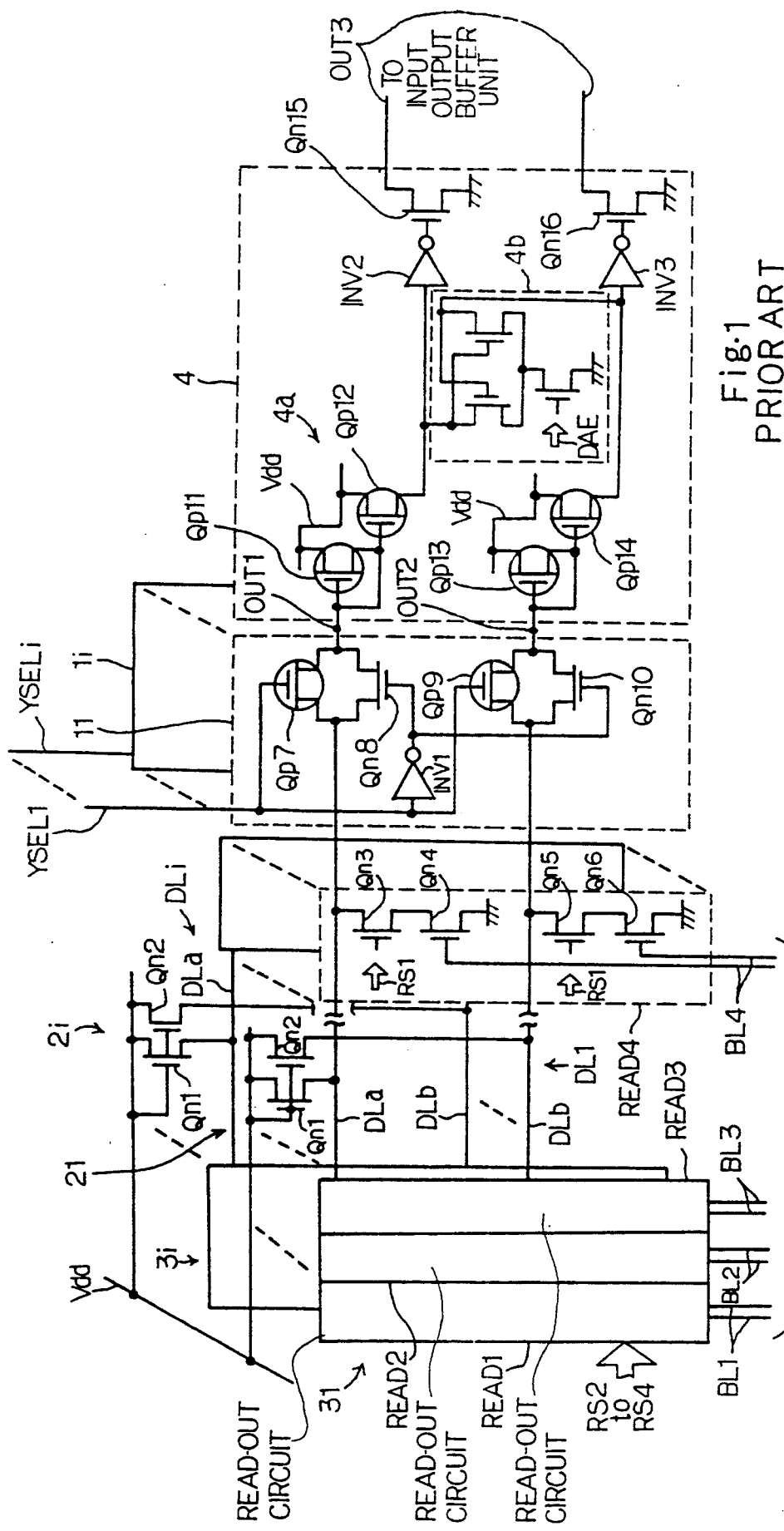
FIG. 1 is a circuit diagram showing the arrangement of the read-out circuit, the block selector and the read data amplifier incorporated in the prior art dynamic random access memory device.
Figure 2:
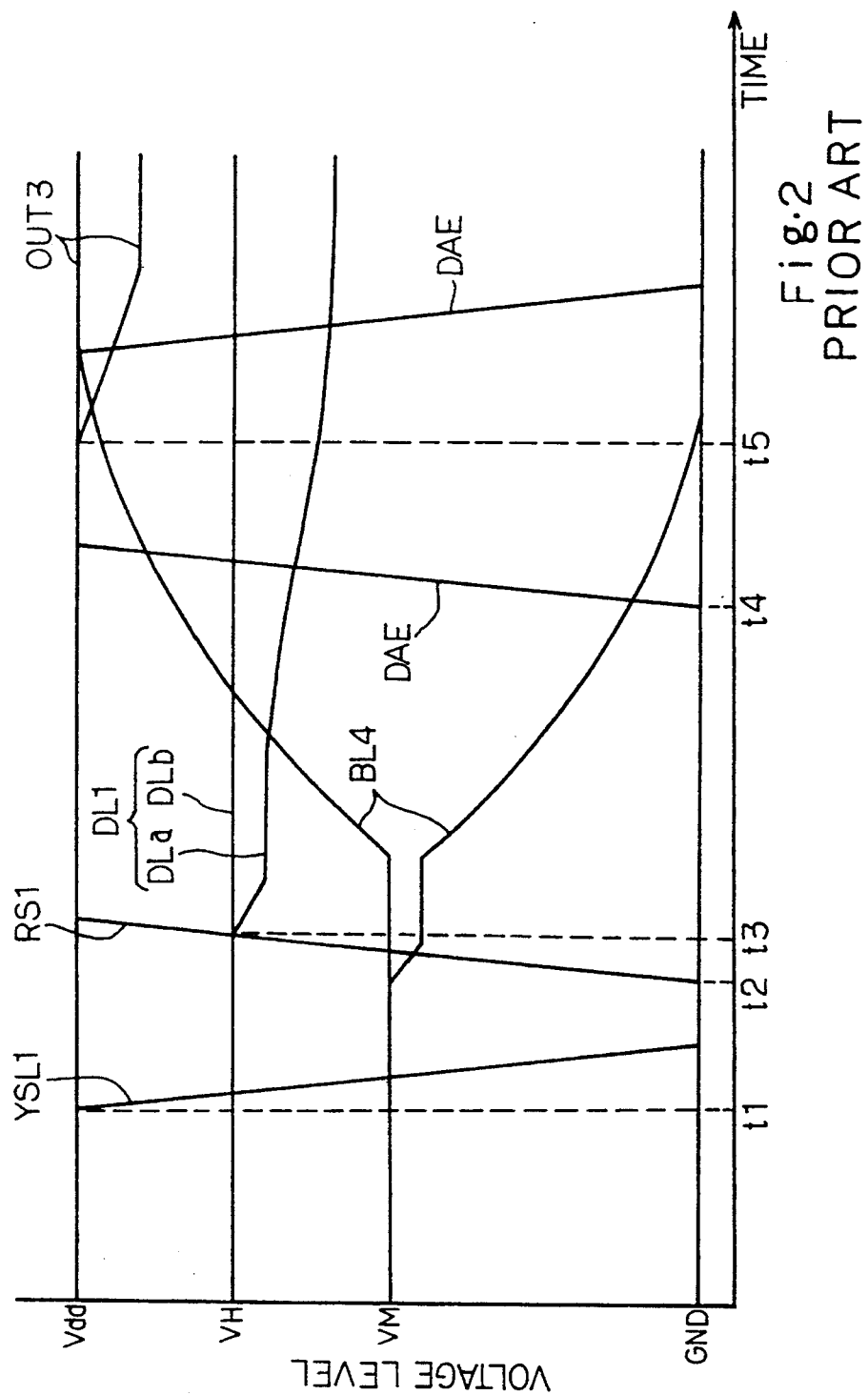
FIG. 2 is a timing chart showing the read-out cycle of the prior art dynamic random access memory device.
Figure 3:
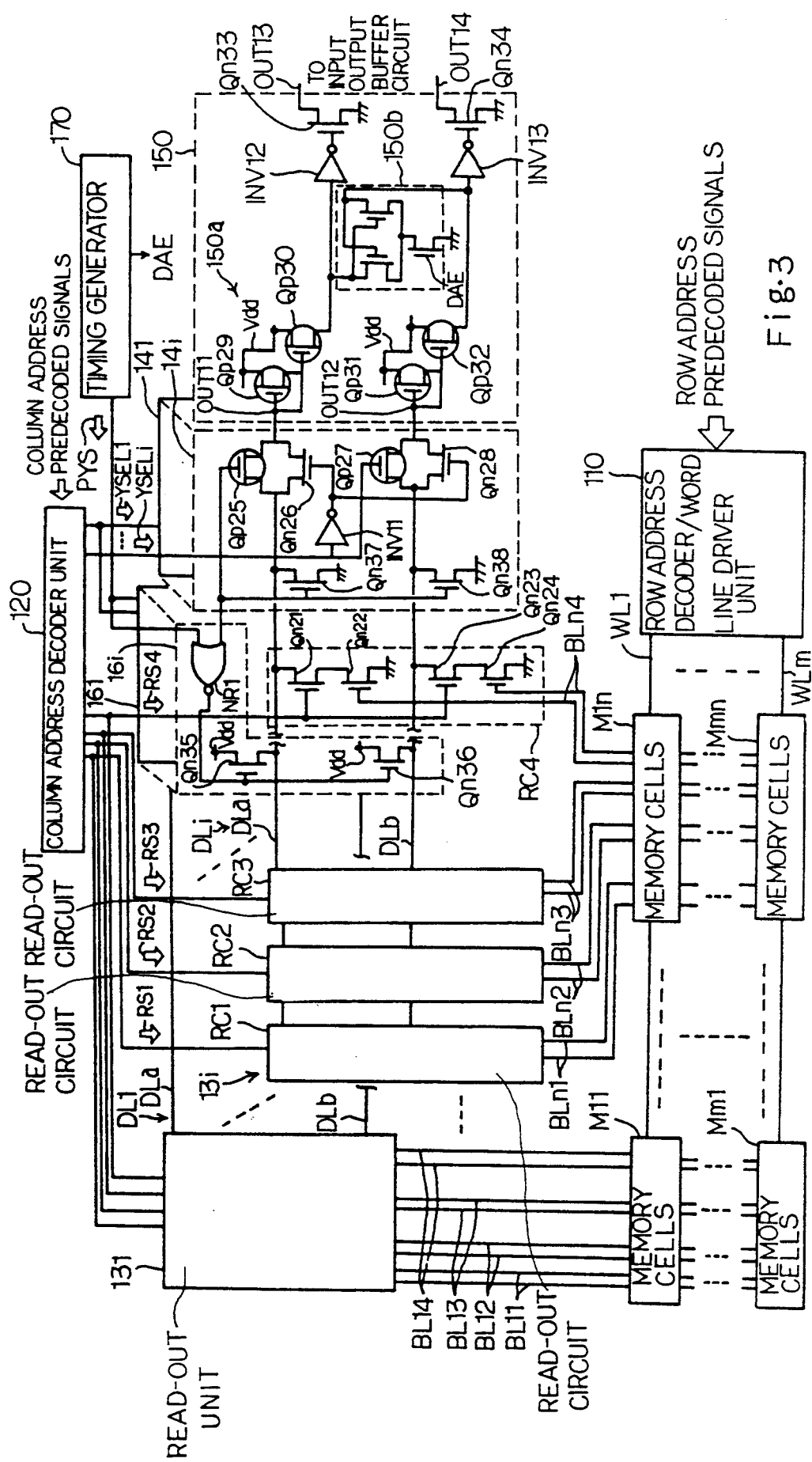
FIG. 3 is a circuit diagram showing the arrangement of essential parts of a dynamic random access memory device according to the present invention.

Referring to FIG. 3 of the drawings, a dynamic random access memory device embodying the present invention comprises a plurality of memory cells grouped into a plurality of memory cell blocks M11, M1n, Mm1 and Mmn arranged in rows and columns. In this instance, each of the memory cell blocks M11 to Mmn includes four memory cells, and four bit line pairs BL11/BL12/BL13/BL14 . . . or BLn1/BLn2/BLn3/BLn4 are shared between each column of memory cell blocks M11 to Mm1 or M1n to Mmn. Ever four bit line pairs form a bit line pair group.

The dynamic random access memory device further comprises a row address decoder/word line driver unit 110, and a plurality of word lines WL1 to WLm are respectively coupled with the rows of memory cell blocks M11 to M1n and Mm1 to Mmn. The row address decoder/word line driver 110 is responsive to row address predecoded signals for energizing one of the word lines WL1 to WLm. When a word line is energized, the memory cells of the associated row are conducted with the bit line pairs BL11 to BLn4, and data bits stored therein produce potential differences on the bit line pairs BL11 to BLn4, respectively. The four bit line pairs of each bit line pair group BL11 to BL14 or BLn1 to BLn4 are respectively assigned first column addresses.

A column address decoder unit 120 is incorporated in the dynamic random access memory device, and is responsive to column address predecoded signals for producing first decoded signals RS1 to RS4 indicative of one of the first column addresses and second decoded signals YSEL1 to YSELi indicative of a second column address.

The dynamic random access memory device further comprises a plurality of data line pairs DL1 to DLi, and the plurality of data line pairs DL1 to DLi are respectively associated with columns of memory cell blocks M11 to Mmn. Second column addresses are respectively assigned to the data line pairs DL1 to DLi, and each of the data line pairs DL1 to DLi consists of two data lines labeled with "DLa" and "DLb".

The dynamic random access memory device further comprises a plurality of read-out units 131 to 13i respectively coupled between the bit line pair groups BL11/BL12/BL13/BL14 to BLn1/BLn2/BLn3/BLn4 and the data line pairs DL1 to DLi, and each of the read-out units 131 to 13i has four read-out circuits RC1, RC2, RC3, RC4 respectively coupled with the four bit line pairs of the associated bit line group. All of the read-out circuits RC1 to RC4 of the read-out units 131 to 13i are similarly arranged, and only the read-out circuit RC4 of the unit 13i is illustrated in detail in FIG. 3.

Namely, the read-out circuit RC4 comprises two series combinations of n-channel enhancement type switching transistors Qn21/Qn22 and Qn23/Qn24 connected between the data lines DLa and DLb of the associated pair DLi and a ground voltage line. The first address decoded signals RS1 to RS4 are distributed to the n-channel enhancement type switching transistors Qn21 and Qn23 of the four read-out circuits RC1 to RC4 of each read-out unit, and the first address decoded signals RS1 to RS4 select one of the read-out circuits RC1 to RC4 from each of the read-out units 131 to 13i. The four bit line pairs of each bit line pair group are connected with the gate electrodes of the n-channel enhancement type switching transistors Qn22 and Qn24 of the associated read-out unit, and the data bit on one of the four bit line pairs causes the n-channel enhancement type switching transistors Qn22 and Qn24 to selectively turn on. As a result, the data bits on the selected bit line pairs are transferred to the data line pairs DL1 to DLi in the form of potential difference.

The dynamic random access memory device further comprises a plurality of selector circuits 141 to 14i, and the selector circuits 141 to 14i have the same circuit arrangement. The selector circuits 141 to 14i are associated with the data line pairs DL1 to DLi, respectively, and each of the selector circuits 141 to 14i comprises two parallel combinations of p-channel enhancement type switching transistors and n-channel enhancement type switching transistors Qp25/Qn26 and Qp27/Qn28 and an inverter INV11. The parallel combinations Qp25/Qn26 and Qp27/Qn28 are respectively coupled with the data lines DLa and DLb and a pair of common output nodes OUT11/OUT12 shared between all of the selector circuits 141 to 14i, and are responsive to the second address decoded signals YSEL1 to YSELi for conducting the associated data line pair with the pair of common output nodes OUT11 and OUT12.

Namely, the second column address decoded signals YSEL1 to YSELi are distributed to the selector circuits 141 to 14i, respectively, and each of the second column address decoded signals is directly supplied to the gate electrodes of the p-channel enhancement type switching transistors Qp25 and Qp27 and through the inverter INV11 to the gate electrodes of the n-channel enhancement type switching transistors Qn26 and Qn28 of the associated selector unit. Since only one of the second address decoded signals YSEL1 to YSELi goes down to the ground voltage level, one of the data line pairs DL1 to DLi is coupled with the pair of common output nodes OUT11 and OUT12, and a small potential difference due to difference in current between the data lines DLa and DLb is propagated from the selected data line pairs DL1 or DLi to the pair of common output nodes OUT11 and OUT12.

A read data amplifier circuit 150 is further incorporated in the dynamic random access memory device, and is shared between all of the selector circuits 141 to 14i. The read data amplifier circuit 150 comprises a preamplifier 150a implemented by four p-channel enhancement type amplifying transistors Qp29 to Qp32, a main differential amplifier 150b enabled with an internal control signal DAE, two inverters INV12 and INV13 connected with the main differential amplifier 150b and two n-channel enhancement type driving transistors Qn33 and Qn34.

The small potential difference between the common output nodes OUT11 and OUT12 is amplified by the preamplifier 150a, and supplies a potential difference to two input/output nodes of the main differential amplifier 150b. The main differential amplifier 150b increase the magnitude of the potential difference, and the increased potential difference is supplied through the inverters INV12 and INV13 to the gate electrodes of the n-channel enhancement type driving transistors Qn33 and Qn34. The n-channel enhancement type driving transistors Qn33 and Qn34 selectively ground output signal lines OUT13 and OUT14, and produces a potential difference indicative of the accessed data bit between the output signal lines OUT13 and OUT14.

The dynamic random access memory device according to the present invention further comprises a plurality of precharge circuits 161 to 16i, and all of the precharge circuits 161 to 16i are similarly arranged. Each of the precharge circuits 161 to 16i comprises a NOR gate NR1 enabled with a timing control signal PYS supplied from a timing generator 170 and two n-channel enhancement type switching transistors Qn35 and Qn36 coupled between a positive power voltage line Vdd and the data lines DLa and DLb of the associated data line pair. The timing generator 170 shifts the timing control signal PYS to the ground voltage level after the second decoded signals selects one of the data line pairs DL1 to DLi, and the timing control signal PYS is recovered from the ground voltage level to the power voltage level when the voltage level on one of the data lines reaches the precharge level lower than the power voltage level by the threshold of the n-channel enhancement type switching transistor. While the NOR gate is being enabled with the timing control signal PYS, the NOR gates NR1 of the precharge circuits are responsive to the second decoded signals YSEL1 to YSELi, and only one of the NOR gates NR1 of the precharge circuits 161 to 16i supplies the positive high voltage level to the associated n-channel enhancement type switching transistors Qn35 and Qn36. Then, the n-channel enhancement type switching transistors Qn35 and Qn36 turn on, and charge the associated data line pair. However, the other precharge circuits are disabled with the second decoded signals of the positive power voltage level.

Since only one of the precharge circuits 161 to 16i charges the associated data line pair for a short time period, not only current consumption is decreased but also the access speed is increased as will be described hereinlater. However, if a dynamic random access memory device aims at improvement of current consumption only, the n-channel enhancement type switching transistors Qn35 and Qn36 may be directly gated with the complementary signals of the second decoded signals YSEL1 to YSELi. On the other hand, if a dynamic random access memory device aims at improvement of the access time only, the n-channel enhancement type switching transistors Qn35 and Qn36 may be directly gated with the complementary signal of the timing control signal PYS.

A plurality pairs of n-channel enhancement type discharging transistors Qn37 and Qn38 are further incorporated in the dynamic random access memory device, and are respectively associated with the plurality of data line pairs DL1 to DLi. However, only one pair of n-channel enhancement type discharging transistors Qn37 and Qn38 are illustrated in FIG. 3. The n-channel enhancement type discharging transistors Qn37 and Qn38 are gated with the second decoded signals YSEL1 to YSELi, respectively, and connect the non-selected data line pairs with the ground voltage line for the next access.

Figure 4:
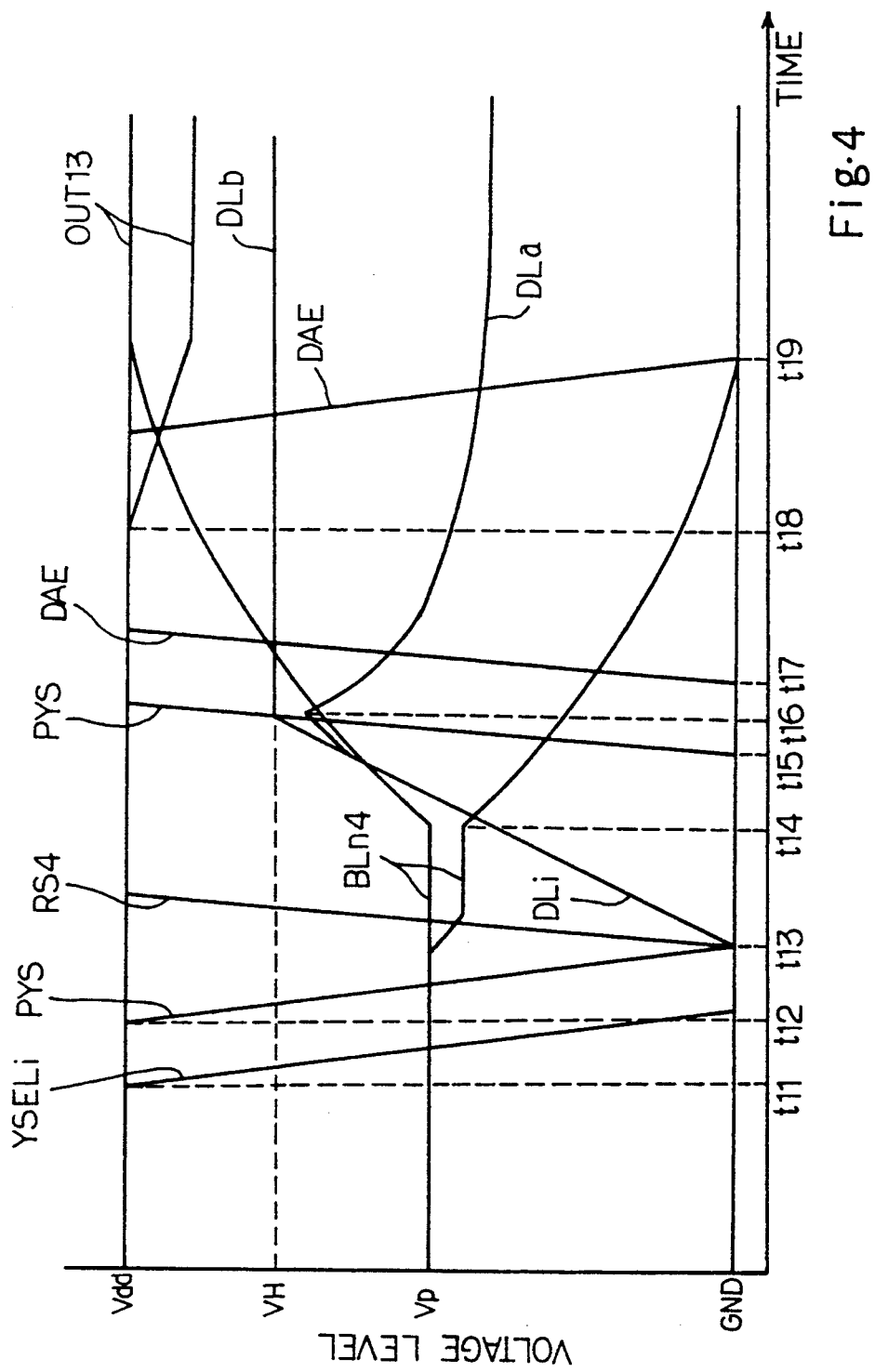
FIG. 4 is a timing chart showing a read-out cycle of e dynamic random access memory device according to the present invention.

Description is hereinbelow made on a read-out cycle carried out in the dynamic random access memory device with reference to FIG. 4 on the assumption that a data bit stored in the leftmost cell of the memory cell block M1n is accessed. First, the row address decoder/word line driver unit 110 drives the word line WL1 over the power voltage level Vdd, and data bits are read out from the memory cell blocks M11 to M1n to the bit line pairs BL11 to BL14 to BLn1 to BLn4. The bit line pairs BL11 to BL14 to BLn1 to BLn4 propagate potential differences indicative of the read-out data bits to the read-out units 131 to 13i, and a sequential selection is carried out as follows.

The column address decoder unit 120 starts the second decoded signal YSELi indicative of the data bit line pair DLi to go down at time t11; however, the other second decoded signals remain in the positive power voltage level Vdd. With the second decoded signal YSELi of the ground voltage level, the selector unit 14i connects the data line pair DLi with the pair of common output nodes OUT11 and OUT12, and the NOR gate NR1 of the precharge circuit 16i is enabled. However, the second decoded signal YSELi causes the n-channel enhancement type discharging transistors Qn37 and Qn38 coupled with the data line pair DLi to turn off, but the other data line pairs are still grounded. Since the other second decoded signals remains in the positive power voltage level, the NOR gates of the other precharge circuits are left disabled.

At time t12, the timing generator 170 starts the timing control signal PYS to go down to the ground voltage level, and only the NOR gate NR1 of the precharge circuit 16i is responsive to the timing control signal PYS. The NOR gate NR1 produces the output signal of a positive high voltage level, and supplies the output signal to the gate electrodes of the n-channel enhancement type switching transistors Qn35 and Qn36. Current flows from the positive power voltage line Vdd through the n-channel enhancement type switching transistors Qn35 and Qn36 to the data line pair DLi, and the data line pair DLi starts rising toward a high voltage level VH at time t13. However, the other data line pairs are isolated from the positive power voltage line Vdd, and remain in the ground voltage level. Thus, the current consumption is less than that of the prior art. The high voltage level VH is lower than the positive power voltage level Vdd by a threshold of the n-channel enhancement type switching transistors Qn35 and Qn36.

When the precharge circuit 16i starts the precharging, the column address decoder circuit 120 also starts the first decoded signal RS4 to go up toward the positive power voltage level Vdd, and keeps the other first decoded signal RS1 to RS3 in the ground voltage level. As a result, the read-out circuits RC4 of all the read-out units 131 to 13i become responsive to the potential differences on the bit line pairs BL14 to BLn4, and the bit line pairs BL14 to BLn4 allow the n-channel enhancement type switching transistors Qn22 and Qn24 to complementarily turn on and off.

A sense amplifier unit (not shown) is activated for developing the potential difference at time t14, and the timing generator 170 starts the timing control signal PYS to recover from the ground voltage level toward the positive power voltage level Vdd at time t15. Then, the NOR gate NR1 shifts the output signal to the ground voltage level, and the n-channel enhancement type switching transistors Qn35 and Qn36 turn off, thereby completing the precharging. If the output signal of the NOR gate NR1 passes through the threshold of the n-channel enhancement type switching transistors Qn35 and Qn36 at time t16, the data line DLb of the data line pair DLi keeps the precharge voltage level VH at time t16, but the data line DLa rapidly goes down because of the isolation from the positive power voltage line Vdd. Thus, only the potential difference on the bit line pair BLn4 is transferred through the read-out unit 13i to the data line pair DLi, and the selector unit 14i in turns transfers the potential difference from the data line pair DLi to the pair of common output nodes OUT11 and OUT12. Moreover, the NOR gate NR1 keeps the n-channel enhancement type switching transistors Qn35 and Qn36 off after the timing control signal PYS is recovered from the ground voltage level, and the potential difference is rapidly developed on the data line pair DLi.

The preamplifier 150a develops the potential difference at the pair of common output nodes OUT11 and OUT12, and the timing generator 170 starts the activation signal DAE to go up toward the positive power voltage level Vdd at time t17. Then, the main amplifier 150b is activated, and the inverters INV12 and INV13 cause the n-channel enhancement type switching transistors Qn33 and Qn34 to complementarily turn on and off. For this reason, the voltage levels on the output signal lines OUT13 and OUT14 are separated at time t18. Although the activation signal DAE is recovered to the ground voltage level at time t19, the potential difference indicative of the accessed data bit is left on the output signal lines OUT13 and OUT14.

As will be appreciated from the foregoing description, one of the precharge circuits 161 to 16i according to the present invention completes the precharging to the data line pair selected with the second decoded signals YSEL1 to YSELi upon reaching the precharge level VH, and the current consumption and the access speed are improved.

Second Embodiment

Figure 5:
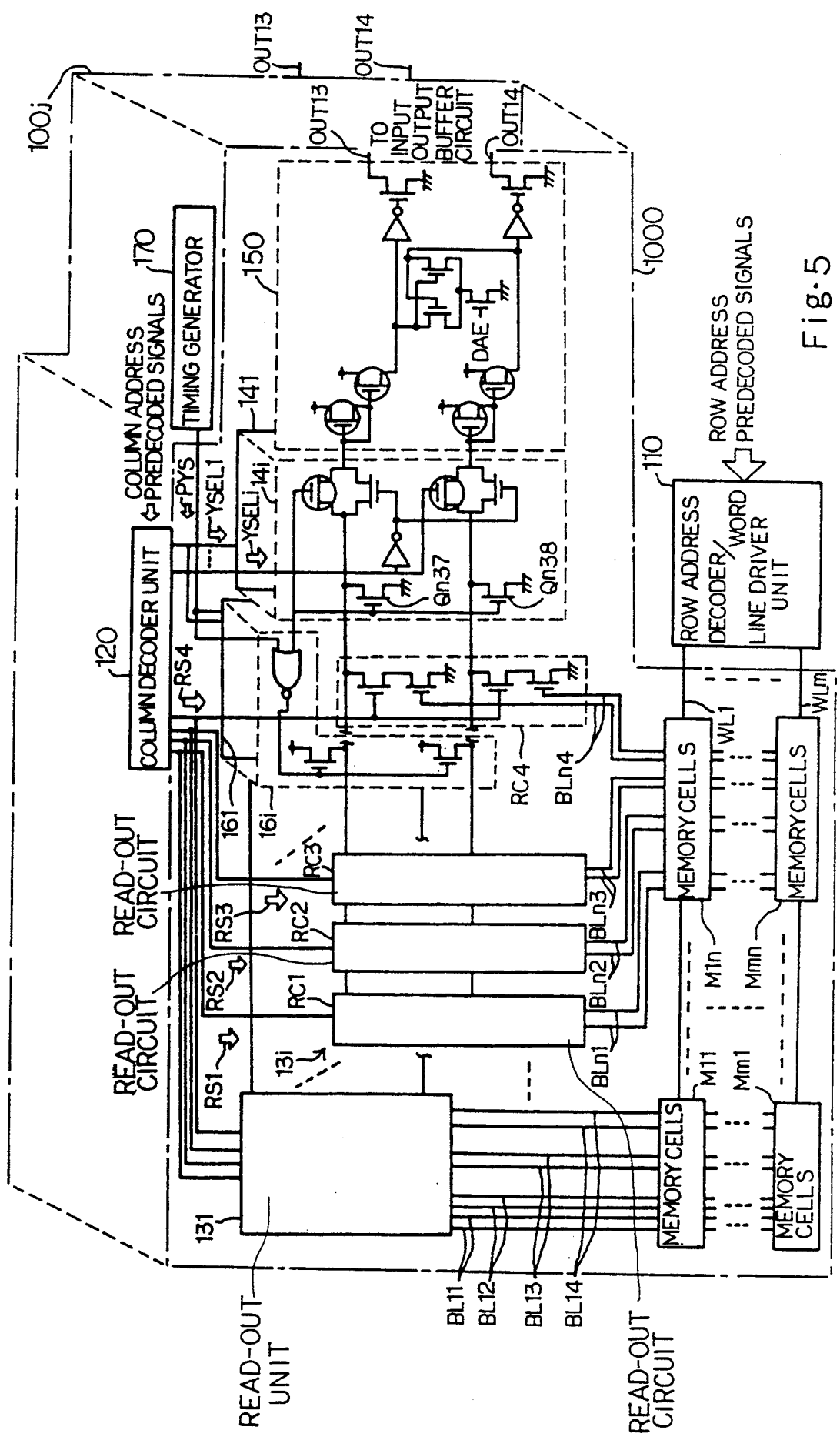
FIG. 5 is a circuit diagram showing the arrangement of another dynamic random access memory device according to the present invention.

Turning to FIG. 5 of the drawings, another dynamic random access memory device embodying the present invention comprises a plurality of data storage units 1000 to 100j, and each of the plurality of data storage units 1000 to 100j includes the memory cell blocks M11 to Mmn, the bit line pair groups BL11/BL12/BL13/BL14 to BLn1/BLn2/BLn3/BLn4, the read-out units 131 to 13i, the sense amplifier unit (not shown), the selector circuits 141 to 14i, the read data amplifier circuit 150, the precharge circuits 161 to 16i and the n-channel enhancement type discharging transistors Qn37 and Qn38. The row address decoder/word line driver unit 110, the column decoder unit 120 and the timing generator 170 are shared between the data storage units 1000 and 100j, and a plurality of data bits are concurrently accessible from the outside thereof.

The dynamic random access memory device achieves all the advantages of the first embodiment, and no further description is incorporated hereinbelow for the sake of simplicity.

Third Embodiment

Figure 6:
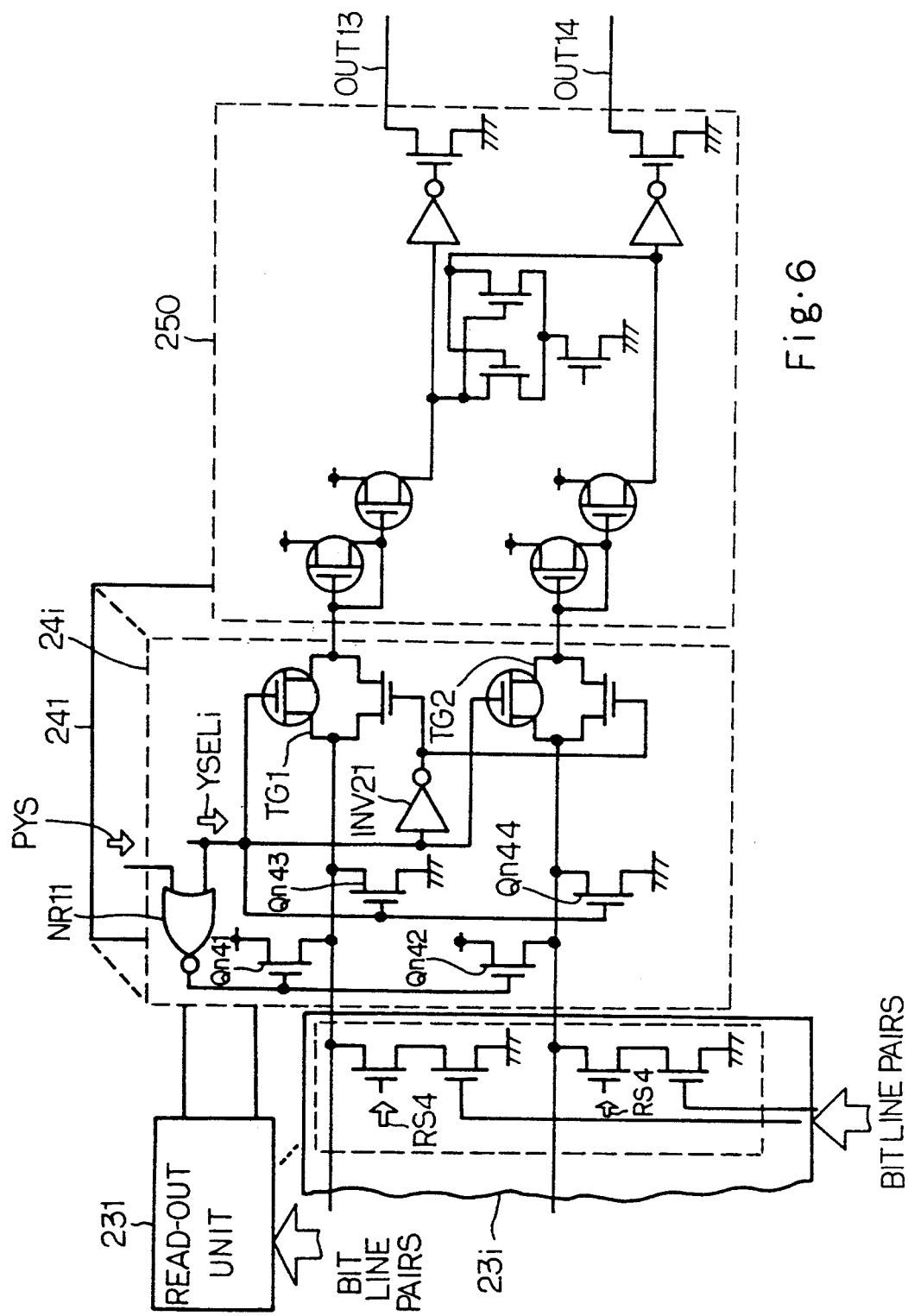
FIG. 6 is a circuit diagram showing the arrangement of yet another dynamic random access memory device according to the present invention.

Turning to FIG. 6 of the drawings, yet another random access memory device embodying the present invention comprises a plurality groups of bit line pairs, a plurality of read-out units 231 to 23i, a plurality of selector units 241 to 24i and a read data amplifier circuit 250. Since the read-out units 231 to 23i and the read data amplifier circuit 250 are similar in arrangement to those of the first embodiment, description thereon is omitted from the following description.

All of the selector circuits 241 to 24i are identical in arrangement, and incorporates a precharge circuit, i.e., n-channel enhancement type precharging transistors Qn41 and Qn42 and a NOR gate NR11 and a pair of n-channel enhancement type discharging transistors Qn43 and Qn44 into the arrangement for selective transmission, i.e., two transfer gates TG1 and TG2 and an inverter INV21. The access speed is further improved, because the precharge circuits are closer to the selector circuits than the precharge circuits 161 to 16i.

Although particular embodiments of the present invention have been shown and described, it will be obvious to those skilled in the art that various changes and modifications may be made without departing from the spirit and scope of the present invention. For example, the present invention is applicable to any type of semiconductor memory device having a charging unit exclusively used for data line pairs, and the semiconductor memory device may fabricated on a single semiconductor chip either alone or together with other function blocks.

What is claimed is:

1. A semiconductor memory device comprising:
   a) a plurality of addressable memory cells arranged in rows and columns;
   b) a plurality of bit line pairs grouped into a plurality of bit line pair groups assigned respective first addresses, and associated with said plurality of addressable memory cells for transferring a plurality of data bits in the form of potential differences;
   c) a plurality of data line pairs respectively assigned second addresses;
   d) a first selecting means responsive to first address decoded signals indicative of one of said first addresses assigned to one of said plurality of bit line pair groups for transferring data bits between said bit line pairs of the selected bit line pair group and said plurality of data line pairs, respectively;
   e) a second selecting means responsive to second address decoded signals indicative of one of said second addresses for transferring one of said data bits between the data line pair assigned the second address and a data amplifier circuit; and
   f) a charging means coupled between a source of current and said plurality of data line pairs for charging to a predetermined voltage level before data bits are transferred to said plurality of data line pairs, said charging means isolating said plurality of data line pairs from said source of current when one of the data line of each data line pair reaches said predetermined level.

2. The semiconductor memory device as set forth in claim 1, in which said first selecting means comprises a plurality of read-out units respectively associated with said plurality of bit line pair groups, and each having a plurality of read-out circuits respectively supplied with said first address decoded signals and respectively associated with the bit line pairs of the associated bit line pair group, each of said read-out circuits having a series combination of first and second switching transistors coupled between one of the data lines of the associated data line pair and a constant voltage source and a series combination of third and fourth switching transistors coupled between the other of said data lines of said associated data line pair and said constant voltage source, one of said first address decoded signals being supplied to gate electrodes of said respective first and third switching transistors, the associated bit line pair being connected with gate electrodes of said second and fourth switching transistors.

3. The semiconductor memory device as set forth in claim 1, in which said second selecting means comprises a plurality of selector circuits respectively associated with said plurality of data line pairs and a pair of common output nodes shared between said plurality of selector circuits, and each having an inverter producing a complementary signal of one of said address second decoded signals and two transfer gates responsive to said one of said second address decoded signals and the complementary signal thereof for coupling the associated data line pair with said pair of common output nodes.

4. The semiconductor memory device as set forth in claim 2, in which said charging means selectively charges said plurality of data line pairs indicated by said second address decoded signals.

5. The semiconductor memory device as set forth in claim 4, in which said charging means comprises a plurality of precharge circuits respectively associated with said plurality of data line pairs, and each having a logic gate enabled with a timing control signal and responsive to one of said second decoded signals for producing an output signal of an active level, a first charging transistor coupled between one of the data lines of the associated data line pair and a constant voltage source and gated by said output signal of said active level and a second charging transistor coupled between the other of said data lines and said constant voltage source, said timing control signal being shifted to an active level before said first address decoded signals selects one of said read-out circuits of each read-out unit, said timing control signal being recovered from said active level to an inactive level when one of said data lines of the associated data line pair reaches said predetermined voltage level.

6. The semiconductor memory device as set forth in claim 5, in which further comprising a plurality pairs of discharging transistors respectively coupled between said plurality of data line pairs and said constant voltage source and respectively responsive to said second address decoded signals for coupling non-selected data line pairs of said plurality of data line pairs with said constant voltage source.

7. The semiconductor memory device as set forth in claim 1, in which said plurality of addresable memory cells, said plurality of bit line pairs, said plurality of data line pairs, said first selecting means, said second selecting means and said charging means form a data storage unit, said semiconductor memory device comprising a plurality of data storage unit each identical with said data storage unit.

8. A semiconductor memory device comprising:
a) a plurality of addresable memory cells arranged in rows and columns;
b) a plurality of bit line pairs grouped into a plurality of bit line pair groups assigned respective first addresses, and assioacted with said plurality of addresable memory cells for transferring a plurality of data bits in the form of potential differences;
c) a plurality of data line pairs respectively assigned second addresses;
d) a first selecting means responsive to first address decoded signals indicative of one of said first addresses assigned to one of said plurality of bit line pair groups for transferring data bits between said bit line pairs of the selected bit line pair group and said plurality of data line pairs, respectively;
e) a second selecting means responsive to second address decoded signals indicative of one of said second addresses for transferring one of said data bits between the data line pair assigned the second address and a data amplifier circuit; and
f) a charging means responsive to said second address decoded signals for charging one of said plurlity of data line pairs indicated by said second address decoded signald to a predetermined voltage level before data bits are transferred to said plurality of data line pairs.

9. The semiconductor memory device as set forth in claim 8, in which said first selecting means comprises a plurality of read-out units respectively assoicated with said plurlaity of bit line pair groups, and each having a plurality of read-out circuits respectively asupplied with said first address decoded signals and respectively assioacted with the bit line pairs of the assioacted bit line pair group, each of said read-out circuits having a series combination of first and second switching transistors coupled between one of the data lines of the assioacted data lin pair and a constant voltage source and a series combination of third and fourth switching transistors coupled between the other of said data lines of said assioacted data linepair and said constant voltage source, one of said first address decoded signals being supplied to gate electrodes of said respective first and third switching transistors, the assioacted bit line pair being connected with gate electrodes of said second and fourth switching transistors.

10. The semiconductor mmory device as set forth in claim 8, in which said second selecting means comprises a plurality of selecctor circuits respectively assioacted with said plurality of data line pairs and a pair of common output nodes shared between said plurality of selecotr circuits, and each having an inverter producing a complementary signal of one of said second adress decoded signals and two transfer gates responsive to said one of said second address decoded signals and the complementary signal thereof for coupling the assocaited data line pair with said pair of common output nodes.

11. The semicodnctor memory device as set forth in claim 9, in which said charging means selectively charges said data line pair indicated by said second address decoded signals before said first address decoded signals selects one of the bit line pairs from each bit line pair group, said charging means isolating all of said data line pairs form a current source when said data line pair reaches said predetermined voltage level.

12. The semiconductor memory device as set forth in claim 11, in which said charging means comprises a plurality of precharge circuits respectively associated with said plurality of data line pairs, and each having a logic gate enabled with a timing control signal and responsive to one of said second decoded signals for producing an output signal of an active level, a first charging transistor coupled between one of the data lines of the associated data line pair and a constant voltage source and gated by said output signal of said active level and a second charging transistor coupled between the other of said data lines and said constant voltage source, said timing control signal being shifted to an active level before said first address decoded signals selects one of said read-out circuits of each read-out unit, said timing control signal being recovered from said active level to an inactive level when one of said data lines of the associated data line pair reaches said predetermined voltage level.

13. The semiconductor memory device as set forth in claim 12, in which further comprising a plurality pairs of discharging transistors respectively coupled between said plurality of data line pairs and said constant voltage source and respectively responsive to said second address decoded signals for coupling non-selected data line pairs of said plurality of data line pairs with said constant voltage source.

14. The semiconductor memory device as set forth in claim 8, in which said plurality of addressable memory cells, said plurality of bit line pairs, said plurality of data line pairs, said first selecting means, said second selecting means and said charging means form a data storage unit, said semiconductor memory device comprising a plurality of data storage unit each identical with said data storage unit.

* * * * *

UNITED STATES PATENT AND TRADEMARK OFFICE
CERTIFICATE OF CORRECTION

PATENT NO. : 5,357,474
DATED : October 18, 1994
INVENTOR(S) : Matano et al.

It is certified that error(s) appears in the above-identified patent and that said Letters Patent is hereby corrected as shown below:

Column 5, line 5, delete "e" and insert --a--;

Column 7, line 65, delete "D11" and insert --DL1--;

Column 12, line 3, delete "assoicated" and insert --associated--;

Column 12, line 20, delete "plurlity" and insert --plurality--;

Column 12, line 22, delete "signald" and insert --signals--;

Column 12, line 27, delete "assoicated" and insert --associated--;

Column 12, line 28, delete "plurlaity" and insert --plurality--;

UNITED STATES PATENT AND TRADEMARK OFFICE
CERTIFICATE OF CORRECTION

PATENT NO. : 5,357,474
DATED : October 18, 1994
INVENTOR(S) : Matano et al.

It is certified that error(s) appears in the above-identified patent and that said Letters Patent is hereby corrected as shown below:

Column 12, line 29, delete "assupplied" and insert --supplied--;

Column 12, line 31, delete both occurrences of "assoicated" and insert --associated--;

Column 12, lines 34 and 35, delete "assoicated data lin" and insert --associated data line--;

Column 12, line 38, delete "assoicated data linepair" and insert --associated data line pair--;

Column 12, line 41, delete "assoicated" and insert --associated--;

Column 12, line 44, delete "mmory" and insert --memory--;

Column 12, line 46, delete "selecctor" and insert --selector--;

Column 12, line 46, delete "assoicated" and insert --associated--;

Column 12, lines 48 and 49, delete "selecotr" and insert --selector--;

Column 12, line 50, delete "adress" and insert --address--;

Column 12, lines 53 and 54, delete "assocaited" and insert --associated--;

Column 12, line 56, delete "semicodnctor" and insert --semiconductor--;

UNITED STATES PATENT AND TRADEMARK OFFICE
CERTIFICATE OF CORRECTION

PATENT NO. : 5,357,474
DATED : October 18, 1994
INVENTOR(S) : Matano et al.

It is certified that error appears in the above-indentified patent and that said Letters Patent is hereby corrected as shown below:

Column 12, line 62, delete "form" and insert —from—.

Signed and Sealed this

Eighth Day of August, 1995

Attest:

BRUCE LEHMAN

*Attesting Officer*    *Commissioner of Patents and Trademarks*